United States Patent
Gupta et al.

(10) Patent No.: US 9,245,828 B2
(45) Date of Patent: Jan. 26, 2016

(54) HIGH SPEED SIGNAL CONDITIONING PACKAGE

(71) Applicant: Mindspeed Technologies, Inc., Newport Beach, CA (US)

(72) Inventors: Atul K. Gupta, Aliso Viejo, CA (US); Ryan S. Latchman, Irvine, CA (US); Marek S. Tlalka, San Marcos, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 13/940,121

(22) Filed: Jul. 11, 2013

(65) Prior Publication Data

US 2014/0021597 A1    Jan. 23, 2014

Related U.S. Application Data

(60) Provisional application No. 61/670,567, filed on Jul. 11, 2012.

(51) Int. Cl.
| | |
|---|---|
| *H01L 23/488* | (2006.01) |
| *H01L 23/00* | (2006.01) |
| *H01L 25/065* | (2006.01) |

(Continued)

(52) U.S. Cl.
CPC ............. *H01L 23/488* (2013.01); *H01L 24/49* (2013.01); *H01L 25/0655* (2013.01); *H01L 2224/48227* (2013.01); *H01L 2224/49113* (2013.01); *H01L 2224/49171* (2013.01); *H01L 2924/15747* (2013.01); *H05K 1/0209* (2013.01);

(Continued)

(58) Field of Classification Search
CPC ........... H01L 2224/48091; H01L 2924/01079; H01L 2924/14; H01L 2924/01029; H01L 2224/48247
USPC ........................................................ 257/692
See application file for complete search history.

(56) References Cited

U.S. PATENT DOCUMENTS

| | | | |
|---|---|---|---|
| 5,173,766 | A | 12/1992 | Long et al. |
| 5,302,022 | A | 4/1994 | Huang et al. |

(Continued)

FOREIGN PATENT DOCUMENTS

GB        2 292 279        2/1996

OTHER PUBLICATIONS

FlipChips Dot Corn "Tutorial 2—Solder Bump Flip chip", http://www.flipchips.com/tutorial102a.html, 7pages.

(Continued)

*Primary Examiner* — Lex Malsawma
*Assistant Examiner* — Long Le
(74) *Attorney, Agent, or Firm* — Weide & Miller, Ltd.

(57) ABSTRACT

A package and integrated circuit assembly is configured to perform signal conditioning on a signal. The assembly includes a line card having line card contacts that correspond to conductors in the line card connector. Two or more integrated circuits are configured to perform signal conditioning on the signal and the two or more integrated circuits are configured within a package into at least a first row and a second row on the package. The package includes a grid array of bonding pads to electrically connect to the two or more integrated circuits through bond wires or down bonds such that the structure of the grid array corresponds in physical arrangement or bond pad pitch to the line card contacts. This assembly also includes an electrical connection from the two or more integrated circuits to the line card through the package.

19 Claims, 5 Drawing Sheets

(51) Int. Cl.
*H05K 1/02* (2006.01)
*H05K 1/11* (2006.01)
*H05K 1/14* (2006.01)

(52) U.S. Cl.
CPC ............... *H05K 1/111* (2013.01); *H05K 1/141* (2013.01); *H05K 2201/041* (2013.01)

(56) References Cited

U.S. PATENT DOCUMENTS

| | | | |
|---|---|---|---|
| 5,411,918 A | | 5/1995 | Keible et al. |
| 5,477,082 A | * | 12/1995 | Buckley et al. ............... 257/679 |
| 5,525,546 A | | 6/1996 | Harada et al. |
| 5,576,756 A | | 11/1996 | Baty et al. |
| 5,652,462 A | * | 7/1997 | Matsunaga et al. ......... 257/686 |
| 5,675,179 A | | 10/1997 | Shu et al. |
| 5,717,252 A | | 2/1998 | Nakashima et al. |
| 5,738,525 A | | 4/1998 | Davies |
| 6,040,984 A | | 3/2000 | Hirakawa |
| 6,109,508 A | | 8/2000 | Orcutt |
| 6,365,966 B1 | | 4/2002 | Chen et al. |
| 6,489,850 B2 | | 12/2002 | Heineke et al. |
| 6,831,352 B1 | | 12/2004 | Tsai |
| 6,954,082 B2 | | 10/2005 | Grilletlc |
| 7,478,029 B1 | | 1/2009 | Joffe |
| 7,501,709 B1 | | 3/2009 | Hool et al. |
| 7,888,202 B1 | * | 2/2011 | Abughazaleh et al. ....... 438/253 |
| 2002/0168798 A1 | * | 11/2002 | Glenn et al. ................. 438/110 |
| 2005/0073038 A1 | | 4/2005 | Kuo et al. |
| 2009/0200657 A1 | * | 8/2009 | Liu et al. ....................... 257/691 |
| 2009/0274202 A1 | * | 11/2009 | Hanke et al. .................. 375/220 |
| 2012/0080789 A1 | * | 4/2012 | Shiota et al. .................. 257/737 |

OTHER PUBLICATIONS

"Highly Accelerated Stress Test (HAST)", © 1991-2001 Innovative Circuits Engineering, Inc., 1 page.
"HAST (Highly Accelerated Stress Testing", © 2003 Environ Laboratories, Inc., 2 pages.
"What is HAST?—Introduction", © 2003, ESPEC North America, Inc., 2 pages.
"What is HAST?—Principles of High Humidity", © 2003, ESPEC North America, Inc., 3 pages.
"What is HAST?—Test Equipment", © 2003, ESPEC North America, Inc., 6 pages.
"What is HAST?—Testing Techniques", © 2003, ESPEC North America, Inc., 4 pages.
"What is HAST?—Reliability Analysis", © 2003, ESPEC North America, Inc., 2 pages.
Backplane Connector Products—Molex, http://www.molex.com/molex/products/group?key=backplane_products&channel=PROD, 10 pages.
Insertion loss—Wikipedia, the free encyclopedia, http://en.wikipedia.org/wiki/Insertion_loss, 2 pages.
"Return Loss", Exfiber © 2012 Exfiber Optial Technologies Co., Ltd, 2 pages.

* cited by examiner

HIGH SPEED SIGNAL CONDITIONING PACKAGE

PRIORITY CLAIM

This application claims priority to and the benefit of U.S. Provisional Application 61/670,567 titled High Speed Signal Conditioning Package which was filed on Jul. 11, 2012. The entire contents of this provisional application are incorporated by reference.

FIELD OF THE INVENTION

This innovation relates to electronics and in particular to package and integrated circuit layout such as for use with signal conditioners on a line card which connect to a backplane.

RELATED ART

The transfer of high speed signals between a high speed backplane and a line card posses several challenges which are not fully addressed by present solutions. These challenges are more difficult to overcome as signal speeds increase beyond the 20 Gb/s range.

Two of the primary challenges are the routing of signal from the backplane to line card connector and signal degradation as signal speed and backplane length increase. With regard to signal routing between the backplane and the line card, it is known that telecommunication systems utilize an orthogonal backplane connector as shown in FIG. 1. In FIG. 1, a backplane 104 includes a high speed bus or communication path (not shown) that carries high speed communication signals between line cards 116. The line card is a well-known device, typically configured as printed circuit board (PCB) that is configured to connect or plug into a connector 108 on the backplane 104 to perform specialized processing on the signals on the backplane.

As part of the interface between the backplane 104 and line card 116 is a backplane connector 112 that includes functionality to plug the line card into and out of the backplane. Line cards 116 are found in high speed telecommunication equipment and are modular in natures such that using the line card connector 112, the line card may plug into and out of the backplane. In this embodiment, the connector 112 is orthogonal to the backplane such that the line card 116 connects at a 90 degree angle to the back plane. Internal to the connector 112 are one or more conductors 124 that connect to one or more electrical contacts 120 on the line card 116.

FIG. 2 illustrates a perspective view of the line card connector and the line card in greater detail. In this example configuration, a connector 112 in the right most position is not included to better show the contacts 120 on the line card 116 to which the connector attaches. To conduct an electrical signal from the connector 112 to the first integrated circuit 208 on the line card 116, there are several traces 210 or paths between the contacts 120 and the first integrated circuit. As is understood in the art, these traces may connect to the integrated circuit through a package 220, which in turn connects to the first integrated circuit 208 that is on the package. Between the first integrated circuit 208 and a second integrated circuit 216 are additional traces 212.

As discussed above, one challenge of prior art designs is the routing of signals from the contacts 120 to the first package 220 and then into the first integrated circuit 208. As can be seen in FIG. 2, the contacts 120 are arranged in a grid array having rows and columns. In contrast, the integrated circuit 208 has contacts at its outer edge forming an outer square of contacts. Other integrated circuit 208 and package 220 designs may include package leads on only two sides of the package.

FIG. 3 illustrates a top plan view of a prior art package and integrated circuit. This is typical of package 220 with bond wires and integrated circuit 208 shown in FIG. 2. The bond wire design could also be replaced with the more modern BGA (ball grid array) design which suffers from many of the same drawbacks. With the BGA design, the bond wires may be replaced by package traces or conductors in the package. In either technology, the arrangement shown in FIG. 3 requires complex fan-out of conductors between the integrated circuit 208 and the package 220.

In this embodiment, the integrated circuit 208 includes a first IC bond pad row 308 and a second IC bond pad row 312. Bond wires 320 connect the IC bond pads 308, 312 to the package 220, and in particular to package bond pads 318. Not all bond wires are shown.

The package 220 includes upper rows 340, 344 of bond pads. The bond wires 320 also connect to bond pads on the package shown as rows 340, 344. At each end of the IC is an exclusion zone 350. It is preferred to not place bond pads, balls, or via that carry high speed signals in the exclusion zone 350. This space may be reserved for power and ground. Likewise, it is undesirable to place traces which carry high speed communication signals under the integrated circuit 208.

As can be seen in FIG. 3, the bond wires 320 fan out from the integrated circuit 208 toward the outer edges of the package 220. The bond wire pitch (distance between bond wires) is smallest at the integrated circuit 208 and larger at the edge of the package 220. However, the length of the bond wires and close proximity of bond wires 320 near the integrated circuit 208 causes the system to suffer from several issues that limit high speed operation. These are discussed below in greater detail.

In addition to the challenges presented by the bond wires in the configuration shown in FIG. 3, the layout of the bond pads 318 on the package 220 are aligned in this example configuration along two upper rows 340, 344, and two lower rows 360, 364. Comparing the arrangements of contacts 120 on the line card 116 shown in FIG. 2 to the arrangement of the rows 340, 344, 360, 364 it can be seen that the physical layout of the package rows to the line card contacts are mismatched. Namely, the package 220 has two closely spaced upper rows 340, 344 and two closely spaced lower rows 360, 366 while the contacts 120 on the line card 116 are spaced evenly in rows and columns and line card has a greater number of contact rows.

This mismatched arrangement undesirably complicates routing of the traces 210 between contacts 120 and the package 220. As a result of the mismatch, complex routing in the line card must occur including use of numerous trace layers in a multiplayer printed circuit board (line card). In addition, vias may be necessary to connect the multilayer traces. Then this complex web of traces and via must connect to the package configuration.

The method and apparatus described below overcovers the challenges and drawbacks of the prior art, and provides further advantages over the prior art.

SUMMARY

To overcome the drawbacks of the prior art and provide additional benefits, a package and integrated circuit assembly is disclosed that is configured to perform signal conditioning on a signal that is present on the line card. In one embodiment this assembly includes a line card having line card contacts that correspond in physical location or arrangement to pins, such as contacts, in a line card connector The line card is configured to connect to a backplane through the line card connector. Also part of this embodiment are two or more integrated circuits that are configured to perform signal conditioning. The two or more integrated circuits are arranged in at least a first row and a second row on the package. The package is configured to accept and contain the two or more integrated circuits. The package further includes a grid array of bonding pads to electrically connect to the two or more integrated circuits through bond wires or down bonds such that the structure of the grid array corresponds in physical arrangement to the line card contacts. This assembly also includes an electrical connection between the package and the two or more integrated circuits, and an electrical connection between the package and the line card.

It is contemplated that the signal conditioning may comprise one or more of equalization, jitter reduction, pre-emphasis, and clock data recovery. The grid array may include a row of bond pads above the first row of integrated circuits and below the first row of integrated circuits. In one embodiment, each of the two or more integrated circuits are dedicated to process communications signals associated with a single communication channel. In one configuration, the assembly is an eight channel line card signal conditioner. The integrated circuit may be coupled to the package by a flip-chip process. Flip chip, also known as controlled collapse chip connection, is a method for interconnecting integrated circuits, to external circuitry with solder bumps that have been deposited onto the integrated circuit pads. The solder bumps are deposited on the integrated circuit pads on the top side of the wafer during the final wafer processing step. In order to mount the integrated circuit to external circuitry (e.g., a printed circuit board or package), it is flipped over so that its top side faces down, and aligned so that the integrated circuit pads align with matching pads on the external circuit, and then the solder is flowed to complete the interconnect. This is in contrast to wire bonding, in which the integrated circuit is mounted upright and wires are used to interconnect the integrated circuit pads to external circuitry.

An assembly including a package, an integrated circuit, and a line card for performing signal conditioning on one or more communication signals. In one configuration, the assembly includes a line card connector having line card connector conductors such that the line card connector conductors electrically connect the line card to a back plane. The line card has a contact array formed of two or more contacts, oriented in rows and columns, which correspond to and electrically connect to the line card connector conductor. The line card also has electrically conductive traces, which are part of the line card, that electrically connect to the two or more contacts. The assembly also includes two or more integrated circuits and a package configured to accept and house the two or more integrated circuits. The package includes bond pads which are electrically connected to the traces of the line card. The bond pads are arranged in a bond pad array that is configured to match the contact array on the line card. In this embodiment, a first group of connecting conductors electrically connects the integrated circuit to the package.

In one embodiment, the first group of connecting conductors are bond wires or down bonds. The package may be a flat no-lead package. In one configuration, the two or more integrated circuits comprise signal conditioners and at least one integrated circuit is dedicated to one channel of a communication system. The two or more integrated circuits may be asymmetrically spaced on the package and not centrally located on the package. In one embodiment, the two or more integrated circuits are evenly spaced or distributed on the package, although the layout of the integrated circuit may be symmetric. If the direction from the line card connector to the package is defined as an X axis and a direction perpendicular to the X axis is defined as a Y axis, in one embodiment there are a greater number of integrated circuits located along the X axis than located along the Y axis.

Also disclosed herein is an assembly which includes a package and integrated circuits such that the package is configured to contain two or more integrated circuits and be mounted onto a line card. In one embodiment, the assembly comprises a package base having an upper surface and a lower surface wherein the upper surface is configured with at least a first row of integrated circuit pads and a second row of integrated circuit pads. At least two rows of bond pads are associated with each row of integrated circuit pads and the bond pads are configured to pass through the package base to form an electrically conductive passage from the upper surface to the lower surface. The location of the at least two rows of bond pads on the package base having a pitch that matches a pitch of the rows of contacts in the line card to which the package is configured to mount. Two or more integrated circuits are located along each row and the integrated circuits are located at the integrated circuit pads and electrically connect to at least one bond pad to thereby electrically connect the integrated circuits to the package.

It is contemplated that at least two of the two or more integrated circuits are signal conditioning integrated circuits and each of the at least two are dedicated to a single communication channel. In one configuration, the number of rows of bond pads on the package base is the same as a number of rows of contacts on the line card. This assembly may further comprise at least one power integrated circuit on the upper surface of the package base and the power integrated circuit is configured to receive an input voltage at a first magnitude and provide as an output a voltage at a second magnitude to at least one of the two or more integrated circuits. In one embodiment the bond pad spacing in a horizontal direction is different than bond pad spacing in a vertical direction. In one embodiment, one or more AC coupling capacitors are integrated in the circuit path.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

When arriving at the innovation disclosed herein, it was realized that prior art solutions suffer from several drawbacks and that these drawbacks result from the bond wire configuration and the mismatch in arrangement and alignment between the line card contacts and the package pins. A package houses and contains an integrated circuit to protect the integrated circuit and establish electrical connection between the integrated circuit and a printed circuit board. For example in reference to FIGS. 2 and 3, insertion loss is one of the critical performance parameters was realized that long traces in the package are very lossy due to fine geometries of the bond ire and the length of the bond wires. For example, the fine geometry bond wire must span between the integrated circuit and the package edge, and then must traverse the complex trace paths in and through the line card. Signal loss and degradation al g this path is significant. By realizing and appreciating the reason for insertion loss, and its affect on performance, the solution proposed below was derived.

Figure 3:
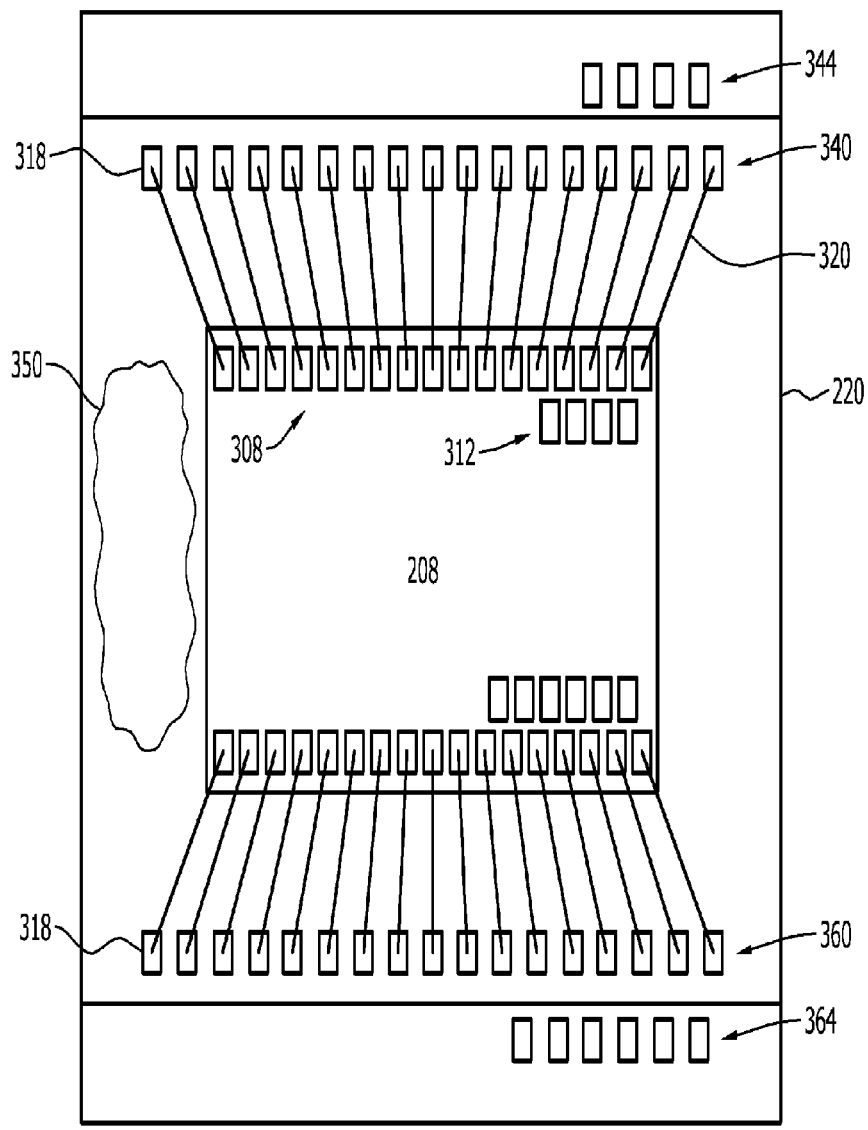
FIG. 3 illustrates a top plan view of an integrated circuit located on a package.

In addition, cross talk performance is poor due to the close proximity of multiple differential pairs, which carry signals from different channels. As shown in FIG. 3, the pitch, which is the distance between the bond wires 320, is small at the end of the package 220, and even smaller as the bond wire approaches and connects to the integrated circuit 208. Thus, although the bond wires fan out from he integrated circuit, crosstalk between the signals on the bond wires 320 occurs due to the close proximity of the bond wires.

Making the unwanted crosstalk coupling worse, the integrated circuit on a line card 116 is often configured to receive, transmit, and process multiple communication channels. As a result, adjacent or proximate bond wires may be conducting signals which are on different channels. This also contributes to increased crosstalk and can make crosstalk cancellation more difficult.

Likewise, as part of this innovation, it was realized that return loss performance is poor due to the vias used on the package which connect traces that located at different layers. The via can be best described as a hole or opening which is established in the package or printed circuit board (PCB) and filed with a conductor to establish an electrical connection. The conductive interface between a PCB trace or package lead and a via establishes a discontinuity that deteriorates return loss when a signal passes through this discontinuity. An increased number of vias in the package or PCB, increases the number of discontinuities, which in turn further deteriorates return loss. In addition, larger vias further deteriorate return loss. In addition, it was realized that the longer the bond wire length, or the greater the use of bond wires, the worse the return loss.

In addition, cost is a drawback in prior art solutions because multilayer substrates require more manufacturing steps which increases cost. Increasing the number of layers and the complexity of trace layout and vias on a package or PCB, undesirably increases the cost of the device.

In addition and in reference to FIG. 3, the integrated circuit 208 shown at the general center of the package 220 is typically configured to perform both receive and transmit functions for multiple channels, such as 8 channels or any number of multiple channels. This creates a concentration of heat, or thermal island, in the center of the package 220. This results in a high temperature concentration which is localized to a single package location. It was realized that this complicated heat dissipation and could lead to overheating and premature failure. In addition, this single high temperature thermal island at the center of the package 220 often required additional configuration changes or accommodations to account for the high temperature area which could otherwise reduce life of the integrated circuit 208. It was realized this is a poor design because the silicon chip has all the electronics and is generally small fraction of the total package. For example, present signal conditioners are packaged in either a QFN (quad-flat no-leads) package with 1 to 4 channels or in BGA (ball grid array) with 4-288 channels. Thus thermal heat generation is concentrated and an undesirable aspect of the prior art designs.

A further drawback to the prior art that was realized is that less or fewer input and output (IO) pairs can be placed on the package because high speed IOs pairs cannot be placed where the chip sits or in certain areas of the package 220 due to location of the integrated circuit 208. This area may be referred to as an exclusion zone 350 and also the area below the integrated circuit. As discussed above, this undesirably increases the concentration of the bond pads as shown in rows 340, 344, 360, 364.

Thus, it was realized that the prior art solutions limit performance from either integration, in the case of QFN (quad-flat, no lead) type packages, or high speed performance in the case of BGA (ball grid array) type packages. The new package and integrated circuit layout as proposed below solves these major concerns and provided additional benefits.

As discussed above, in making this innovation it was also realized that the mismatch in layout when comparing the contacts 120 (shown in FIG. 2) and the rows 340, 344, 360, 364 increased the occurrence of the events listed above which contributed to poor return loss, increased cost, higher thermal concentrations, and insertion loss. As can be appreciated by visual inspection and comparison, the grid array pattern (orthogonal rows and columns) of the contacts do not physically match up to the four rows 340, 344, 360, 364 of bond pads at the top and bottom edge of the package 220. Regardless of whether the package utilizes a ball grid array to contact to the PCB that forms the line card, or the package uses metallic pins which extend outward and downward from the package to the PCB, there is mismatch between the physical layout of the package bond pads and the contacts 120 on the line card.

Figure 4:
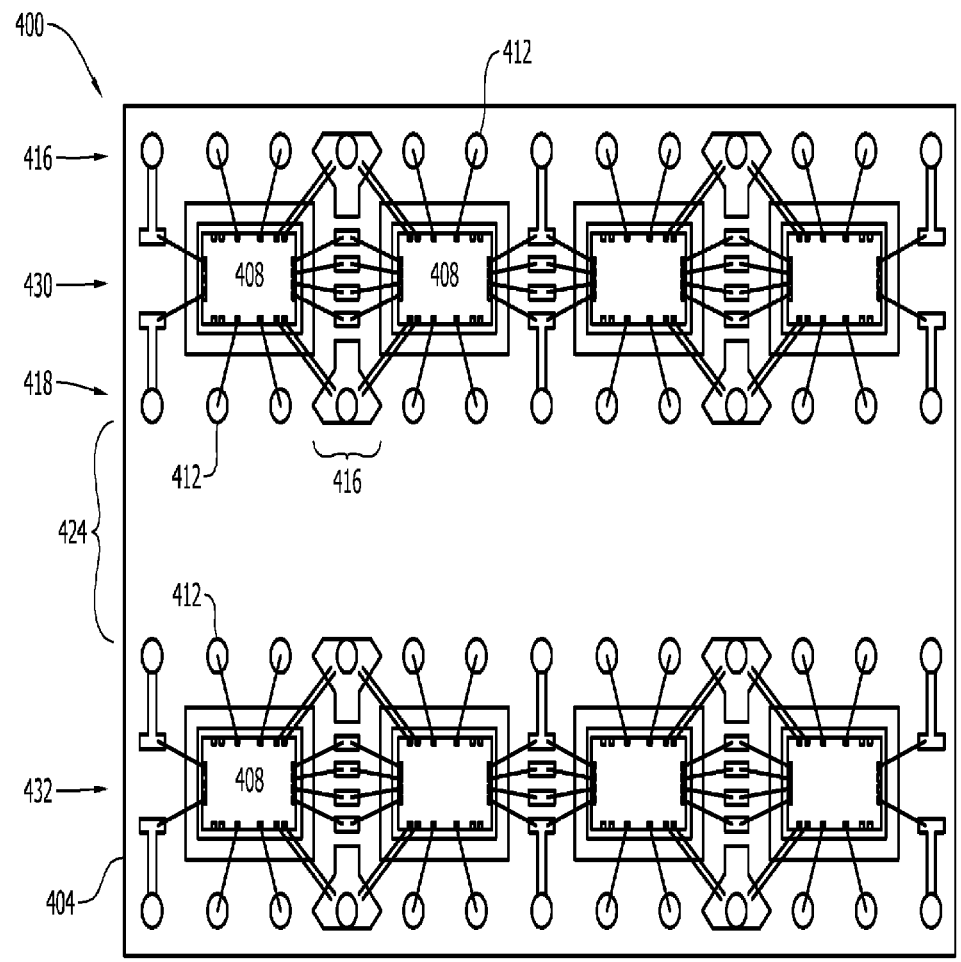
FIG. 4 illustrates an exemplary layout of a multichannel package with multiple integrated circuits within the package.

FIG. 4 illustrates top plan view of an exemplary layout of a multichannel package with multiple integrated circuits within the package. This is but one possible configuration and layout and a such it is contemplated that one of ordinary skill in the art may arrive at different configurations and layouts than that shown in FIG. 4. As shown in FIG. 4, an assembly 400 includes a package 404 and two or more integrated circuits 408. In this embodiment, the integrated circuits 408 are arranged in a first row 430 and a second row 432. Any number of rows of integrated circuits 408 may be on the package. Near the integrated circuits are package bond pad rows 412, 416. Also provided are bond pads 416 which are located between two or more IC 408 as shown and thus may be shared between IC such as for power, ground or common clock or control signals. The bond pads 416 may also be dedicated to a single integrated circuit 408. Arranged in rows 416 418 are package bond pads 412 above and below the top row of IC 408 that carry high speed communication signals or other type signals.

Below the top row of integrated circuits 408 and bond pads 416, 418 are one or more additional rows of IC 408 and bond pads as shown. Between the rows of IC 408 and bond pads is an open space 424 on the package. Above the below each IC row 430 with associated bond pads, is one or more additional rows of integrated circuits 408 and bond pads.

Figure 1:
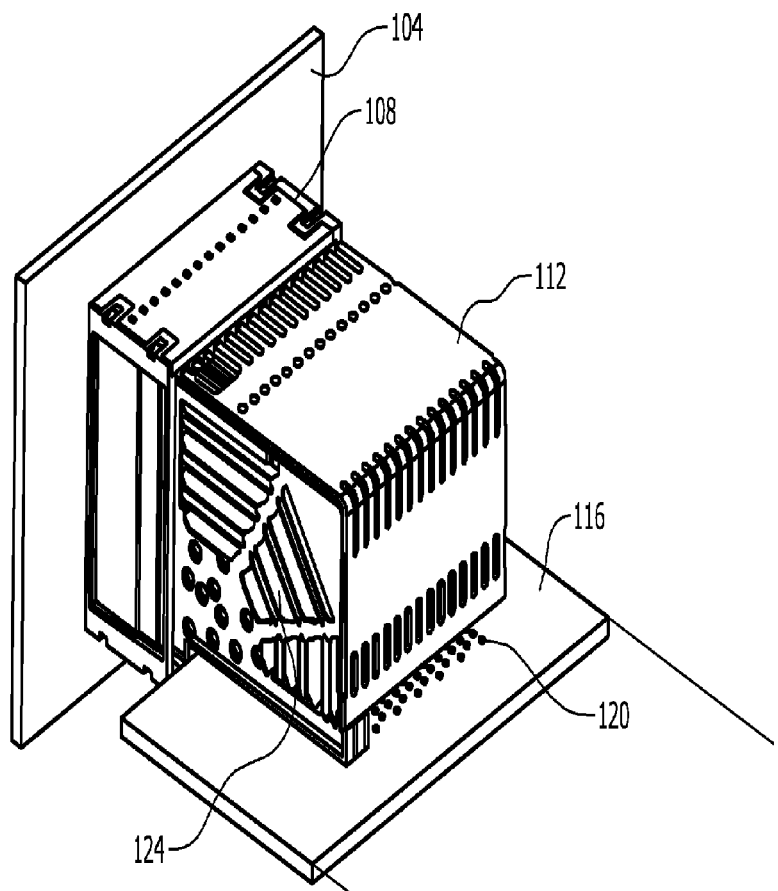
FIG. 1 illustrates a perspective view of a line card connector, a line card, and a backplane.
Figure 2:
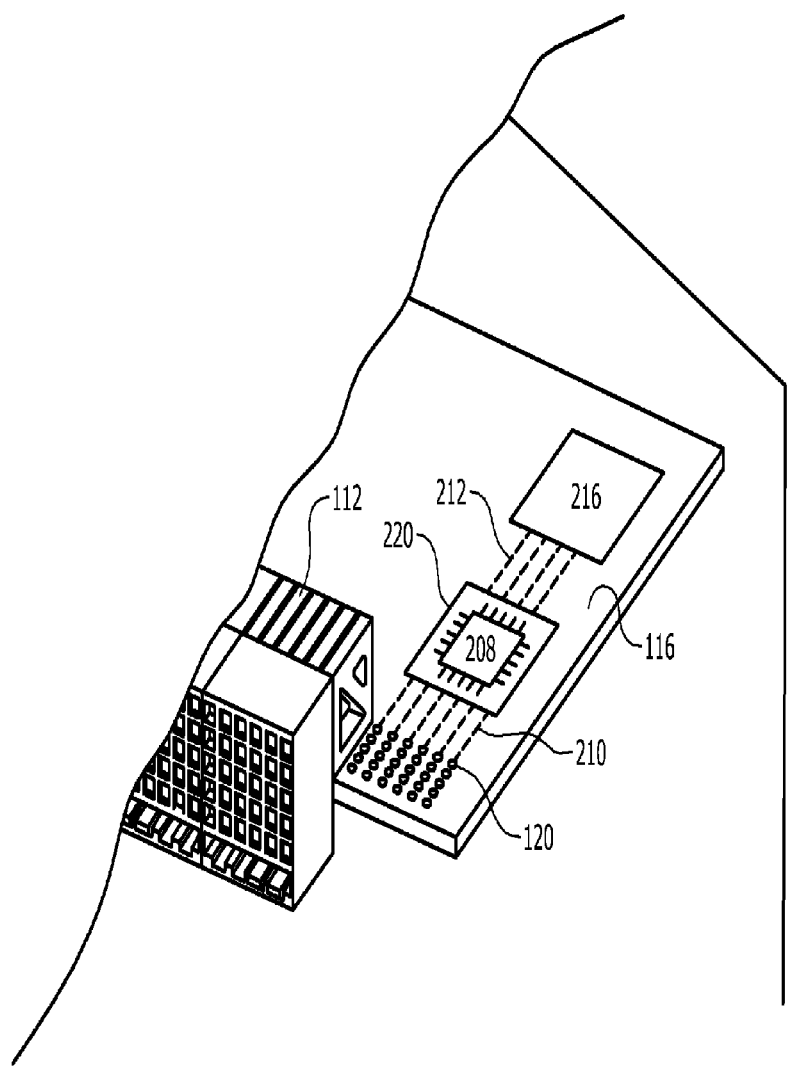
FIG. 2 illustrates a perspective view of a line card connector and a line card having integrated circuit packages thereon.

In one embodiment, the location of the physical layout and configuration of the bond pads are arranged to match the layout of contacts established by a line card connector. As shown in FIGS. 1 and 2, line cards connectors connect orthogonally to the line card and the connection points, referred to herein as contacts 120, form a grid that consists of several rows and columns. By matching the physical layout of the bond pads on the package to the physical layout of the contacts established by the line card connector, routing the traces within or on the line card is greatly simplified.

By matching the physical layout of the bond pads on the package to the physical layout of the contacts established by the line card connector, routing of the traces within or on the line card may be established in a generally straight line between the contact 120 on the line card and the bond pad 412 of the package. While one or more turns or bends of the trace may be required, use of vias are minimized. By avoiding the use of a via through the package and/or the line card to execute complex routing of conductive traces between the contacts 120 and the pads 416, return loss is improved.

Also disclosed herein a configuration which produces a QFN like package or which can be used with a QFN (quad-flat no-lead) package, but instead of having only one integrated circuit, has multiple integrated circuits. QFN packages are known to electrically connect the bond wire node directly downward to the bottom of the package which is also has an electrical contact. The bond wire pad can thus be considered as configured as a single downward connection through the package. This provides the advantage of reducing or eliminating any discontinuity since the electrical conductor is continuous. This also reduces package cost and complexity. This configuration may also be configured with the package bond pads that align with the contact array of a line card.

Referring again to the configuration of FIG. 4, for a given package size, a comparison between the package of FIG. 3 and FIG. 4, the bond wires are significantly shorter in the configuration of FIG. 4 as compared to FIG. 3. This is particularly true for bond wires in the outer rows 344, 364 which are near the edge of the package. Based on the innovation disclosed herein, because each integrated circuit 408 has a shorter bond wire length (and pin lengths if so configured), signal integrity performance is improved. In particular, insertion loss is reduced because the distance from the integrated circuit 408 to the line card and to the connector is reduced. In addition, there is less chance of bond wires touching another bond wire or the package when completed, which reduces failure circuit due to shorts within the package. In addition, a single chip based BGA package can have the same form/fit/function as previously achievable, however, this solution will consume less power than prior art solutions because there is less loss due to the package itself.

As a further benefit to the configuration shown in FIG. 4, the thermal profile is distributed across a greater area of the package 408. As is understood, each integrated circuit 408 generates heat and by distributing the integrated circuits across the package, the heat generated by each integrated circuit 408 is also distributed. This reduces the need for expensive heat distribution or cooling techniques and will increase the life of the integrated circuit which may otherwise fail due to thermal damage.

Yet another advantage to the layout shown in FIG. 4 for a multichannel signal conditioner is that each separate integrated circuit may be configured to process a separate channel. This reduces crosstalk between channels, because crosstalk is a function of the distance between adjacent conductors with greater distances decreasing crosstalk coupling. In addition, the layout proposed in FIG. 4 establishes bond wires with greater pitch, e.g. greater distance between bond wires, for a given size of package as compared to the layout shown in FIG. 3. This greater distance between bond wires decreases crosstalk.

Another advantage to this configuration shown in FIG. 4 is that the low speed signals are routed within the package only on one layer which further improves performance and reduces cost. By limiting the layers within the package, crosstalk and insertion loss is minimized. By maintaining a single layer, no vias are required and return loss is improved, as compared to a multiple layer device having numerous vias.

While this innovation may be useful in numerous different environments, it is contemplated that in one example configuration the innovation is used in a 25 Gb/s signal conditioning or communication system. This assembly is also useful in a multi-channel signal conditioning system for use on a line card of a high speed communication system. Signals in line cards and backplanes suffer from loss and changes in signal quality. As a result, signal conditioning may be performed on the signal, such as on the line card, to improve signal quality and power levels.

Figure 5:
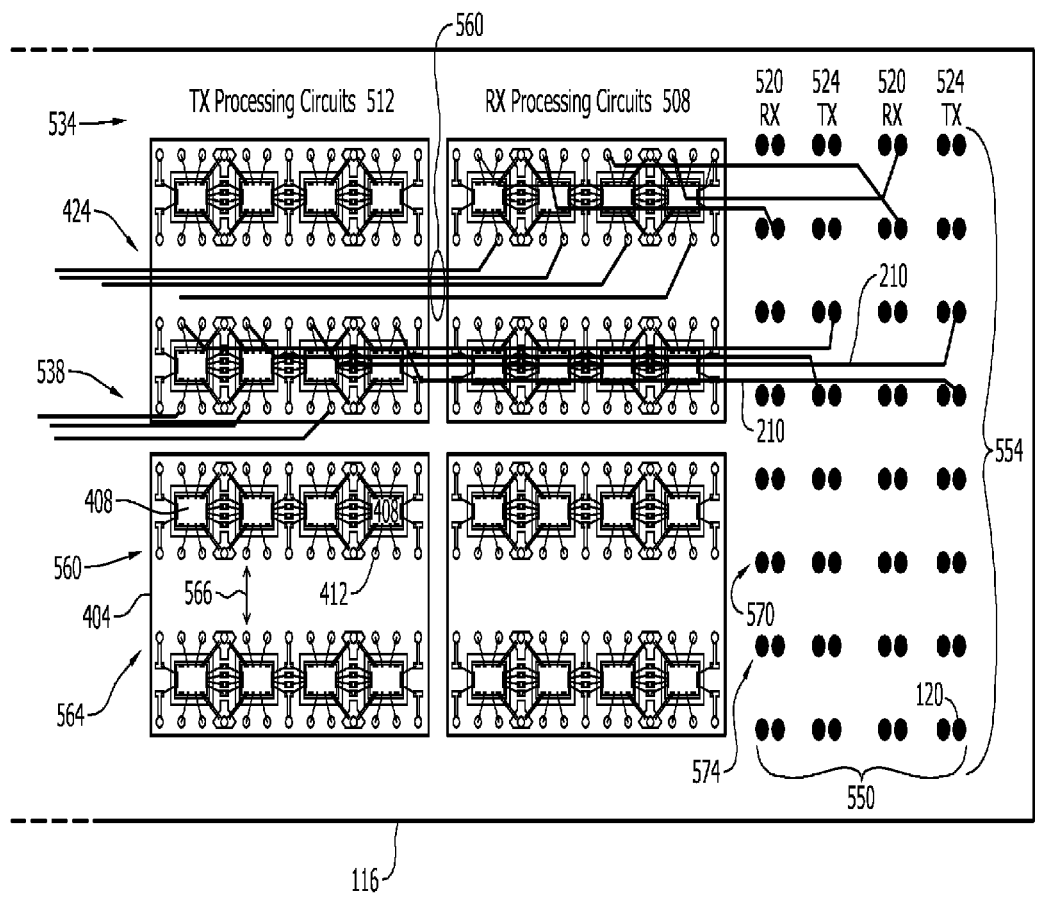
FIG. 5 illustrates a multichannel package in relation to a line card connector contact grid.

FIG. 5 illustrates a top plan view of a multichannel package in relation to a line card connector contact array. FIG. 5 is provided for purposes of discussion and as such not all the elements necessary for operation are shown. One of ordinary skill in the art would understand that additional traces would be provided and that when constructed not all the elements would be visible from a top plan view. In this example embodiment, the contacts 120 would be hidden by the line card connector. Likewise, the traces 210 would be part of the line card 116. Finally, the package 404 would cover and protect the integrated circuits (IC) 408.

As shown, a line card 116 is shown with four main elements. These elements are, from the right hand side to the left hand side of FIG. 5, an array of contacts 120, traces 210, and packages 404 with integrated circuits 408. FIG. 5 illustrates the beneficial relational size and location between the bond pads on the packages 116 (and integrated circuits) and the contacts 120.

The contacts 120 are arranged in a number of rows 554, which for purposes of this discussion are defined as being in the X axis or direction. The contacts 120 are also presented in a number of columns 550 to form an array. The columns 550 are defined as the Y axis or direction. In this example embodiment, there are eight rows of contacts 120. In other embodiments, the number of contacts will be based on the line card connector. The columns 550 are separated into receiver path contacts 520 and transmit path contacts 524.

Moving away from the contacts 120 in a left hand direction, the packages are arranged with bond pads 412 that are in rows match up with and correspond to the rows 554 or contacts 120. In this embodiment there are four total rows of integrated circuits 408 with each integrated circuit row having a row of bond pads 412 above and below the integrated circuit row. This equates to eight total rows of bond pads, which corresponded in physical relationship to the eight rows of contacts 120. In one embodiment the pitch of the contacts 120 is the same as the pitch of the bond pads 412 on the package 408. In this configuration the transmit path processing elements 512 is physically separate from the receiver path processing elements 508 due to being located on separate packages. In one embodiment, from an operational stand point, the receiver processing elements 508 and transmit processing elements 512 appear to a user, from an electrical standpoint to be identical to a prior art design. Although multiple integrated circuits replace a single integrated circuit the capability is the same and additional control signals or connections are not required.

Although shown for purposes of discussion with four packages 404, it is contemplated that in other embodiments, greater of fewer packages may be placed on the line card. Likewise, greater or fewer integrated circuits 408 and rows of bond pads 412 may be established. In one configuration, the total number of rows of bond pads 412 on the packages 404 corresponds to or is the same as the number of rows of contacts 120 on the line card 116. In other embodiments, other factors may control the number of packages, integrated circuits, and bond pads, such as the number of traces needed or common connections between bond pads and contracts. Of note is that in this configuration, and in contrast to the prior art, the bond pad arrangement is selected to such that optimal trace 210 routing is achieved by matching the number of rows of bond pads to the number of rows of contacts. This may correlate to a one to one arrangement between contact rows 554 and bond pad rows, or a non-one to one arrangement, or a match in pitch. In one configuration, the vertical pitch between rows of bond pads 412, such as between row 560 and row 564 is matched exactly to a vertical pitch of contact 120 in contact rows 554, such as between contact row 570, and contact 547. Thus, the distance 566 between bond pad rows 560, 564 may be the same as the distance 566 between contact rows 554. This exact pitch match between bond pad rows and contact rows may be the same for all rows of bond pads and contacts. In one embodiment, the pitch is kept to 1.85 mm although in other embodiments the pitch may be established at different numeric values. It is also contemplated that the pitch value along the horizontal axis may likewise be the same for package bond pads and contact.

Also shown in FIG. 5 are the areas 424, 534, 538 on the line card 116 and package 404 which are which are not occupied, along the X axis, by integrated circuits. These areas include the open space 424 between the upper and lower rows of integrated circuits 408 on a package. There is also available space for trace routing above the integrated circuits 534 and below the integrated circuits 538. As can be seen, this proposed package configuration provides space for trace routing either above or below each row of bond pads. Trace routing is also available, such as for ground, power, clock, and controls signals below the integrated circuits 408.

Through or under these open areas 424, 534, 538 are electrically conductive traces 210 which are provided on the line card 116 to electrically connect the contacts 120 to the integrated circuits 408. Because the rows 554 of the contacts 120 are aligned with the rows of package pads 412, the traces 210 may be run generally straight. Sufficient space is provided between the rows of package bond pads 412 to allow sufficient space for the traces 210. In this example embodiment, there are eight columns 550 of contacts 120, and as a result, there are eight contacts 120 per row 554. Traces 210 from these contacts 120 are routed, typically in a single vertical layer, within the line card 116. As can be seen in FIG. 5, the traces 210 are generally straight, with minimal curves or bends, from the connection between the contacts 120 and a bond pad 412. Trace group 560 provides a good example of the trace arrangement between the integrated circuits 408 in an open area 424.

In one embodiment, the packages are flat no-lead packages. Flat no-leads packages such as QFN (quad-flat no-leads) and DFN (dual-flat no-leads) physically and electrically connect integrated circuits to printed circuit boards. Flat no-leads, also known as microleadframe and SON (small-outline no leads), is a surface-mount technology that connect integrated circuits to the surface of PCBs without through-holes. Flat no-lead is a near chip scale package formed of plastic or other non-conductor that encapsulates the integrated circuit. The package may be made with a planar copper lead frame substrate. Perimeter lands on the package bottom provide electrical connections to the PCB. Flat no-lead packages may include an exposed thermal pad to improve heat transfer out of the integrated circuit or into the PCB or for airflow cooling. Heat transfer can be further facilitated by metal vias in the thermal pad. Ball grid array technology or flip-chip technology may be used. With either technology, contact may be made directly from the package to the single layer which contains the traces. In this way, multilayer structures may be avoided.

This package arrangement greatly improves trace routing. As shown in FIG. 5, the contacts 120 from the line card connector may connect directly to a trace, located in a single layer of PCB that forms the line card 116 and then proceed generally in the X axis toward the packages 404. The traces 210 then rise upward directly to connect to the bond. Because FIG. 5 is a top plan view, all traces are shown as angling slightly and then proceeding in an open area 424, 538. Because of the alignment, fan in and fan out is avoided entirely or greatly reduced. This also results in a lower concentration of bond wires around each integrated circuit.

In addition, some traces 210 may advance downward from the contact 120, directly in the X axis direction, and directly upward into the package 404. If the bond pads 412 are part of a ball grid array or flat, no-lead package, then the bond wires can be avoided. Complex routing of traces 210 is avoided and trace 210 direction is generally maintained in the direction of signal flow, that is, either into or out of the line card connector or downstream processing elements, such as other integrated circuits. Traces may be established in a single layer which reduces cost and complexity of manufacture for the line card PCB. Traces 210 may be routed between the integrated circuits 408 in the open area 424 or in areas 534, 538. After processing by an integrated circuit 408, the signal is routed to a trace 210 and provided to an additional integrated circuit 216 (FIG. 2) for additional processing.

In one embodiment the integrated circuits 408 on the packages 404 comprise signal conditioners. In one embodiment each integrated circuit 408 is dedicated to a single channel. In the embodiment shown in FIG. 5, each integrated circuit 408 is dedicated to either receiver processing for a single channel or transmitter processing for a single channel. The signal conditioning may perform one or more of jitter reduction, equalization, clock data recovery, and/or pre-emphasis.

The trace routing and the correlation of rows as shown in FIG. 5 provides numerous advantages over the prior art. One such advantage is that by having the bond pad locations on the package mirror the contacts of the line card, insertion loss is minimized because bond wires are shortened or eliminated depending on the package configuration. In one embodiment the two or more integrated circuits are asymmetrically spaced on the package and not centrally located on the package. In one embodiment there is asymmetrical spacing between horizontal and vertical bond pads or down pads of the package.

In addition trace distance and routing complexity is reduced leading to shorter traces and fewer bends or angles of the traces, all of which reduces insertion loss and crosstalk coupling. Because it was realized as part of this innovation that the long traces and bond wires are very lossy due to fine geometries of the traces and bond wires, improved trace configuration and routing as shown, greatly reduces insertion loss. This includes a shortening of traces and bond wires, or elimination of bond wires.

In addition, because of the correlation of rows of the bond pads or package lead and the contacts from the line card connector, it is possible to minimize the use of vias on the printed circuit board that forms the line card. As result, this reduces the number discontinuities encountered by the signal as the signal advances between the package and the line card connector.

Another advantage to the configuration shown in FIG. 5 is that less space of the package is unusable as being an exclusion zone. Comparing FIG. 5 to the exclusion zone 350 shown in FIG. 3, the package and integrated circuit configurations of FIGS. 4 and 5 maximize usable package area. The increase in usable package area obtained using the principles disclosed herein is difficult to quantify because it varies on an application by application basis. In one example embodiment for an 8 channel device, the prior art design in a BGA package may require 12 mm×12 mm minimum package area, which is 144 square mm (millimeter) minimum package design. As an improvement over the prior art, the package as disclosed herein for an identical application will require only 11 mm×6 mm, which is only 66 square mm. This is greater than 50% reduction on the PCB area required.

As discussed above in greater detail, crosstalk can also be reduced using the configuration of FIG. 5. Because trace routing is simplified and exclusion zones made smaller, additional space for traces and bond wires is provided, thereby reducing crosstalk potential due to the increased pitch between traces and bond wires. As shown in FIG. 5, pitch is matched between the contacts and the package bond pads or down pads. The term bond pad may be used interchangeably with down pad. A down pad is a conductive pad in a package that extends downward in the package. In addition, if flip chip, BGA, or flat no-lead packaging is adopted for use, crosstalk may be further reduced. It is further contemplated that signal magnitudes may be reduced because, as described above, trace and bond wire length is reduced, and hence signals may be transmitted at lower power levels. Reducing signal power levels reduces power consumption, crosstalk, and heat generation, all of which are benefits to the present design.

In one embodiment, one or more additional integrated circuits are provided on the package shown in FIG. 4 that do not perform the same function as the other integrated circuits. It is contemplated that one or more power supplies or voltage conversion circuits, on a separate integrated circuit, may be placed on the package. For example, if the integrated circuits 408 required two different voltages, than only a higher voltage may be provided to the package, such as to a power integrated circuit (not shown), and the power integrated circuit is configured to a step down or modify the voltage to a second voltage. In other embodiments, a power integrated circuit may be provided to separate and isolate power provided to each channel or each of the other power integrated circuits. Power may be shared either directly on bond wires or through traces in the package of PCB. For power distribution, bond pads may be shared between power integrated circuits, such as shared pads 416 in FIG. 4.

In one configuration, the package and integrated circuit as shown in FIGS. 4 and 5 are configured to share control pins or leads between silicon chips. For example, in reference to FIG. 4 package bond pads or pins 416 may carry a common control signal between two or more integrated circuits 408. The shared connection may occur by bond wires, bond pads, or traces.

It is further contemplated that the integrated circuits 408 may be used to route any type signal, including power, clock signals, or control signals. In such a configuration the signal would pass through the integrated circuit and thereby avoid use of a trace in the printed circuit board, to carry the signal under or around the integrated circuit. Instead, a trace could carry the signal to a first integrated circuit, and then from that integrated circuit the signal would chain through additional integrated circuits and as such a conductive path in the integrated circuit may take the place of, at least partially, traces in the printed circuit board.

As shown in FIGS. 4 and 5, it is proposed to put multiple integrated circuits on a single package and that each integrated circuit may need to be uniquely addressed or identified with a control signal to modify software code, monitor operation, or enable/disable operation. In one embodiment, a down bond is used to uniquely identify an integrated circuit located on the package. Thus, if a particular integrated circuit connects to a bond pad or bond wire, or based on a unique address based on down bond connection, the integrated circuit may be uniquely identified. Likewise, I$^2$C control signaling may be used with or without down bond identification. I$^2$C (Inter-Integrated Circuit, referred to as I-squared-C, I-two-C, or IIC) is a multi-master serial single-ended bus and addressing system used for attaching low-speed peripherals to a motherboard, embedded system, cellphone, or other electronic device. A traditional two wire interface may also be utilized.

It is also contemplated that capacitors may be placed in the high speed signal path such as for purposes of signal isolation using capacitive coupling. In the prior art such capacitor were located external to the package which increased costs and consumed space. These capacitors may be integrated within the integrated circuits or located within the package but external to the integrated circuit.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A package and integrated circuit assembly configured to perform signal conditioning on a line card comprising;
    a line card having a line card contacts that correspond to and are configured to connect to conductors in a line card connector, the line card being configured to connect to a backplane through the line card connector;
    two or more integrated circuits configured to perform signal conditioning, the two or more integrated circuits configured into at least a first row and a second row;
    a package configured with accept and contain the two or more integrated circuits, the package further comprising:
        a grid array of bonding pads to electrically connect to the two or more integrated circuits through bond wires or down bonds, the structure of the grid array corresponding in physical arrangement to the line card contacts, the grid array of bond pads not located directly above or below the line card contacts; and
        a electrical connection from the two or more integrated circuits, through the package, to the line card, such that the electrical connection includes a generally straight trace in a single layer of the line card between the line card contacts and the bonding pads of the package.

2. The package and integrated circuit assembly of claim 1 wherein signal conditioning comprises one or more types of processing selected from the following group: equalization, jitter reduction, pre-emphasis, and clock data recovery.

3. The package and integrated circuit assembly of claim 1 wherein the grid array includes a row of bond pads above the first row of integrated circuits and below the first row of integrated circuits.

4. The package and integrated circuit assembly of claim 1 wherein each of the two or more integrated circuits is dedicated to process communications signals associated with a single communication channel.

5. The package and integrated circuit assembly of claim 1 wherein the assembly is an eight channel line card signal conditioner.

6. The package and integrated circuit assembly of claim 1 wherein the integrated circuit are coupled to the package by a flip-chip process.

7. An assembly including a package, integrated circuit, and line card for performing signal conditioning on one or more communication signals comprising:
   a line card connector having line card connector conductors, the line card connector conductors electrically connect the line card to a back plane;
   a line card having:
      a contact array formed of two or more contacts, oriented in rows and columns, which corresponds to and electrically connects to the line card connector conductors;
      electrically conductive traces that are part of the line card, that electrically connect to the two or more contacts, the traces being generally parallel and straight such that the traces extend between the two or more contacts of the line card and package bond pads;
   two or more integrated circuits;
   a package configured to accept and house the two or more integrated circuits, the package including bond pads which are electrically connected to the traces of the line card, the bond pads being arranged in a bond pad array having row count and spacing that is configured to match row count and spacing of the contact array on the line card, such that the bond pad array and the contact array are located at different locations on the line card; and
   a first group of connecting conductors electrically connecting the integrated circuit to the package.

8. The assembly of claim 7 wherein the first group of connecting conductors are bond wires.

9. The assembly of claim 7 wherein the package is a flat no-lead package.

10. The assembly of claim 7 wherein the two or more integrated circuits comprise signal conditioners and at least one integrated circuit is dedicated to one channel of a communication system.

11. The assembly of claim 7 wherein two or more integrated circuits are asymmetrically spaced on the package and not centrally located on the package.

12. The assembly of claim 7 wherein the direction from line card connector to the package is defined as an X axis and a direction perpendicular to the X axis is defined as a Y axis, there are a greater number of integrated circuits located along the X axis than located along the Y axis.

13. An assembly comprising a package and integrated circuits, the package configured to contain two or more integrated circuits and be mounted onto a line card, the line card connecting to a back plane through a backplane connector contact array on the line card, the backplane connector contact array aligned with contacts of the backplane connector, the assembly comprising:
   a package base having an upper surface and a lower surface wherein the upper surface is configured with at least a first row of integrated circuit pads and a second row of integrated circuit pads;
   at least two rows of bond pads associated with each row of integrated circuit pads, the bond pads configured to pass through the package base to form an electrically conductive passage from the upper surface to the lower surface, the location of the at least two rows of bond pads on the package base having a pitch that matches a pitch of the rows of the backplane connector contact array, the backplane connector contact array located away from the package on an area of the line card that electrically connects to the backplane connector, the bond pads configured to connect to the backplane connector contact array by traces;
   two or more integrated circuits located along each row, the integrated circuits located at the integrated circuit pads and electrically connected to at least one bond pad to electrically connect the integrated circuits to the package.

14. The assembly of claim 13 wherein at least two of the two or more integrated circuits are signal conditioning integrated circuits and each of the at least two are dedicated to a single communication channel.

15. The assembly of claim 13 wherein the number of rows of bond pads on the package base is the same as a number of rows of contacts on the line card.

16. The assembly of claim 13 further comprising at least one bond wire which electrically connects an integrated circuit in the row of integrated circuits to a bond pad in a row of bond pads.

17. The assembly of claim 13 further comprising at least one power integrated circuit on the upper surface of the package base, the power integrated circuit configured to receive an input voltage at a first magnitude and provide as an output a voltage at a second magnitude to at least one of the two or more integrated circuits.

18. The assembly of claim 13 wherein bond pad spacing in a horizontal direction is different than bond pad spacing in a vertical direction.

19. The assembly of claim 13 further comprising one or more AC coupling capacitors integrated in the circuit path.

\* \* \* \* \*